United States Patent [19]

Uratsuji

[11] Patent Number: 5,213,530
[45] Date of Patent: May 25, 1993

[54] THREE-WAY NIP CONTACT TYPE CONTRACTOR

[75] Inventor: Kazumi Uratsuji, Tokyo, Japan

[73] Assignee: Yamaichi Electric Co., Ltd., Tokyo, Japan

[21] Appl. No.: 729,581

[22] Filed: Jul. 15, 1991

[30] Foreign Application Priority Data

Jul. 13, 1990 [JP] Japan ................. 2-185534

[51] Int. Cl.$^5$ ......................... H01R 11/22
[52] U.S. Cl. ................... 439/268; 439/265; 439/856
[58] Field of Search ............ 439/263, 265, 268, 269, 439/851, 856, 857, 861

[56] References Cited

U.S. PATENT DOCUMENTS

| | | | |
|---|---|---|---|
| 3,862,792 | 1/1975 | Jayne | 439/851 |
| 4,341,429 | 7/1982 | Bright et al. | 439/268 |

FOREIGN PATENT DOCUMENTS

| | | | |
|---|---|---|---|
| 0082679 | 6/1983 | European Pat. Off. | 439/268 |
| 1-165578 | 11/1989 | Japan . | |

Primary Examiner—Larry I. Schwartz
Assistant Examiner—Hien D. Vu
Attorney, Agent, or Firm—Wenderoth, Lind & Ponack

[57] ABSTRACT

A three-way nip contact type contactor has first, second and third contacting pieces connected together at their base end portions and arranged side by side in rows extending toward their top end portions. The first and second contacting pieces are arranged to form two sides of a triangle and the third contacting piece is arranged to form the remaining side. A male terminal is nipped by and among the first through third contacting pieces to obtain a contacting relation between the male terminal and each of the first through third contacting pieces. The third contacting piece is provided at its top end portion with a pressure bearing portion. The third contacting piece, when an external force is applied to the pressure bearing portion, is displaced in an opening direction against its elasticity to permit the male terminal to be inserted into and among the first through third contacting pieces. When the third contacting piece is elastically restored in a closing direction and presses against a side surface of the male terminal, the first and second contacting pieces are displaced in the opening direction against their elasticity by a pressing force of the third contacting piece, and slidingly move on the side surface of the male terminal during their displacement in the opening direction.

5 Claims, 4 Drawing Sheets

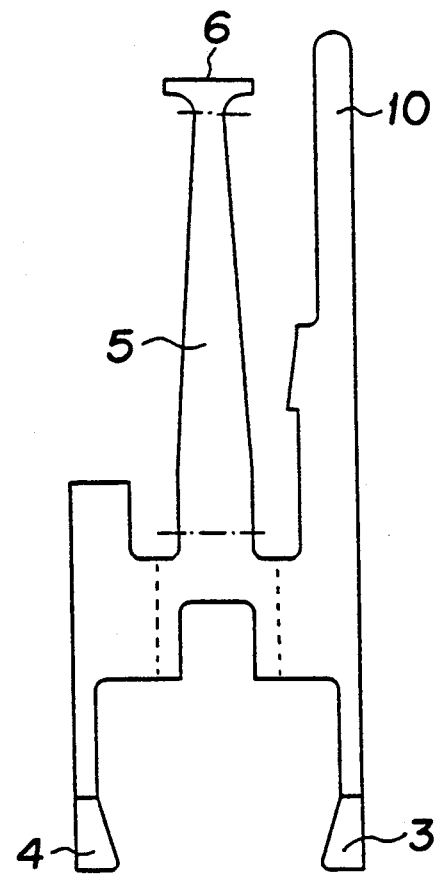

THREE-WAY NIP CONTACT TYPE CONTRACTOR

BACKGROUND OF THE INVENTION

1. Field of the Invention

This invention relates to a three-way nip contact type contactor designed to nip a male contact from three ways in order to obtain an electrical contact therewith.

2. Background of the Invention

Japanese Utility Model Early Laid-open Publication No. Hei 1-165578 discloses a contactor provided with first and second contacting pieces which form two sides of a triangle, and a third contacting piece which forms the remaining side. In this prior art, a male terminal of an IC, etc. is forcedly inserted into and among the first, second and third contacting pieces, thereby dilating the respective contacting pieces in the opening direction against the elasticity thereof and obtaining a pressure contact between the male terminal and the first through third contacting pieces by the restoring force thereof.

However, the above-mentioned contactor has problems such as a large resistance when the male terminal is inserted into the first, second and third contacting pieces. In addition, insertion, and therefore removal, become difficult where the number of poles of male terminals are increased, as in the case of a pin grid array type of IC.

Because of the above-mentioned problems, use of this conventional contactor is practically impossible for a multipolar IC, such as a pin grid array type of IC. Therefore, it remains as a subject to be tackled that, while solving the above-mentioned problems, a high reliability of contacting relation can be obtained by taking advantage of the three-way contact.

SUMMARY OF THE INVENTION

It is therefore an object of the present invention to provide a three-way nip contact type contactor, in which a male terminal can be inserted into and among first, second and third contacting pieces with no load, and yet a highly reliable contact relation can be obtained.

To achieve the above-mentioned object, there is provided a three-way nip contact type contactor, including first, second and third contacting pieces connected together at base end portions thereof and arranged side by side in rows toward the front or top end portions thereof. The first and second contacting pieces are arranged in such a manner as to form two sides of a triangle, and the third contacting piece is arranged in such a manner as to form the remaining side thereof. A male terminal is nipped by and among the first through third contacting pieces to obtain a contacting relation between the male terminal and each of the first through third contacting pieces. The third contacting piece is provided at its front end portion with a pressure bearing portion. The third contacting piece, when an external force is applied to the pressure bearing portion, is displaced in an opening direction against the elasticity thereof in order to permit the male terminal to be inserted into and among the first through third contacting pieces. The first through third contacting pieces are arranged such that, when the third contacting piece is elastically restored in a closing direction and pressed against a side surface of the male terminal, the first and second contacting pieces are displaced in the opening direction against the elasticity thereof by a pressing force of the third contacting piece, slidingly moving on the side surface of the male terminal when they are displaced in the opening direction.

With the above-mentioned construction of the three-way nip contact type contactor of the present invention, when an external force is applied to the pressure bearing portion formed on the front end of the third contacting piece, the third contacting piece is displaced in the opening direction against the elasticity thereof in order to permit the male terminal to be inserted into and among the first through third contacting piece's. Further, when the first contacting piece is elastically restored and pressed against the side surface of the male terminal, the first and second contacting pieces are displaced in the opening direction against the elasticity thereof by the pressing force of the third contacting piece and slidingly move on the side surface of the male terminal. Owing to the sliding movements of the first and second contacting pieces on the side surface of the male terminal, an active metallic surface is exposed and a clean and reliable electric contact relation can be attained.

The above and other objects, characteristic features and advantages of the present invention will become more apparent from the detailed description of the preferred embodiment set forth hereinbelow with reference to the accompanying drawings.

BRIEF DESCRIPTION OF THE DRAWINGS

FIGS. 1 through 8 show a preferred embodiment of the three-way nip contact type contactor according to the present invention, wherein:

FIG. 1 is a plan view of a three-way nip contact type contactor illustrated for the purpose of explaining the sliding movements of first and second contacting pieces with respect to a male contact;

FIG. 2 is a perspective view of the contactor of FIG. 1;

FIG. 3 is another perspective view of the contactor, but viewed from a different direction;

FIG. 4 is an expanded view showing a punched-out contactor punched from a plate material;

FIG. 8 is a vertical sectional view of the contactor showing a contact state of the male terminal with the first through third contacting pieces in the state of FIG. 7(B).

DETAILED DESCRIPTION OF THE PREFERRED EMBODIMENT

Figure 5A:
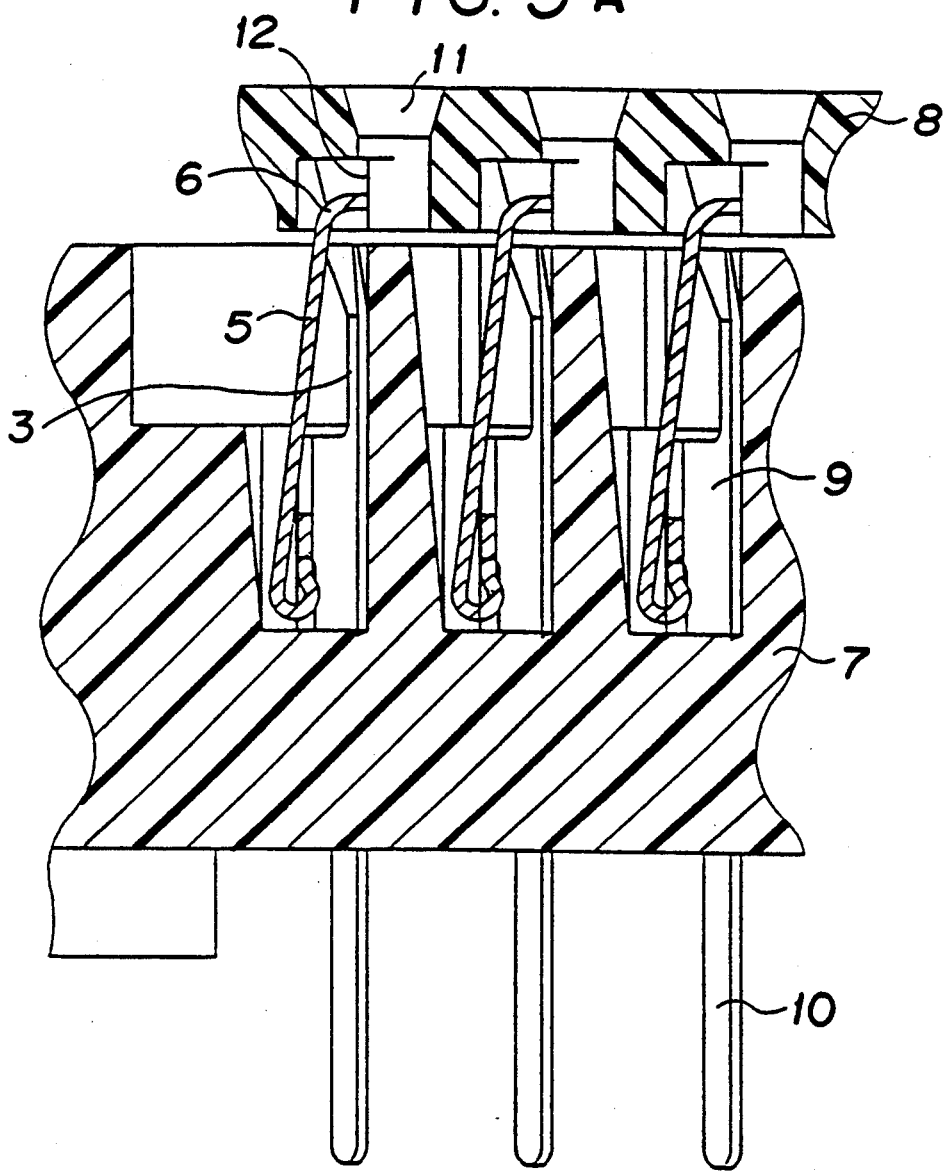
FIG. 5(A) is a sectional view of a socket in which the above-mentioned contactor is used, and shows a state immediately before a male terminal is inserted with a third contacting piece displaced in the closing direction.

One preferred embodiment of a three-way nip contact type contactor according to the present invention will be described in detail with reference to FIGS. 1 through 8.

As previously described, a con&actor 1 has first, second and third contacting pieces 3, 4 and 5 which are to be contacted, under pressure, with a male terminal 2 of a generally circular configuration in section from three ways.

The first through third contacting pieces are connected together at base end portions thereof and are upright and side by side toward the front or to end portions thereof. The first and second contacting pieces 3 and 4 are arranged in such a manner as to form two sides of a triangle, preferably the two legs of an isosceles triangle, and the third contacting piece is arranged in such a manner as to form the remaining side, namely, the base of an isosceles triangle.

In the contactor 1 having the first through third contacting pieces 3, 4 and 5, the third contacting piece 5 is provided at a front end portion thereof with a pressure bearing portion 6 to which an external force is to be applied. Upon application of an external force from its inner side, the pressure bearing portion 6 is displaced, together with the first and second contacting pieces 3 and 4, in a separating direction away from the first and second contacting pieces 3 and 4, namely, in the opening direction against the elasticity thereof.

Figure 5B:
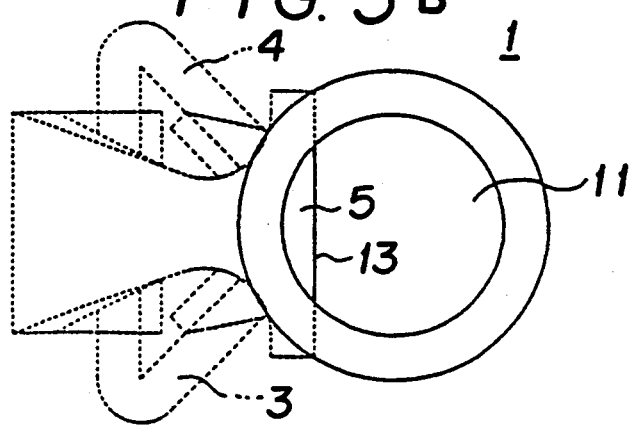
FIG. 5(B) is a plan view of the contactor in the state of FIG. 5(A)
Figure 6A:
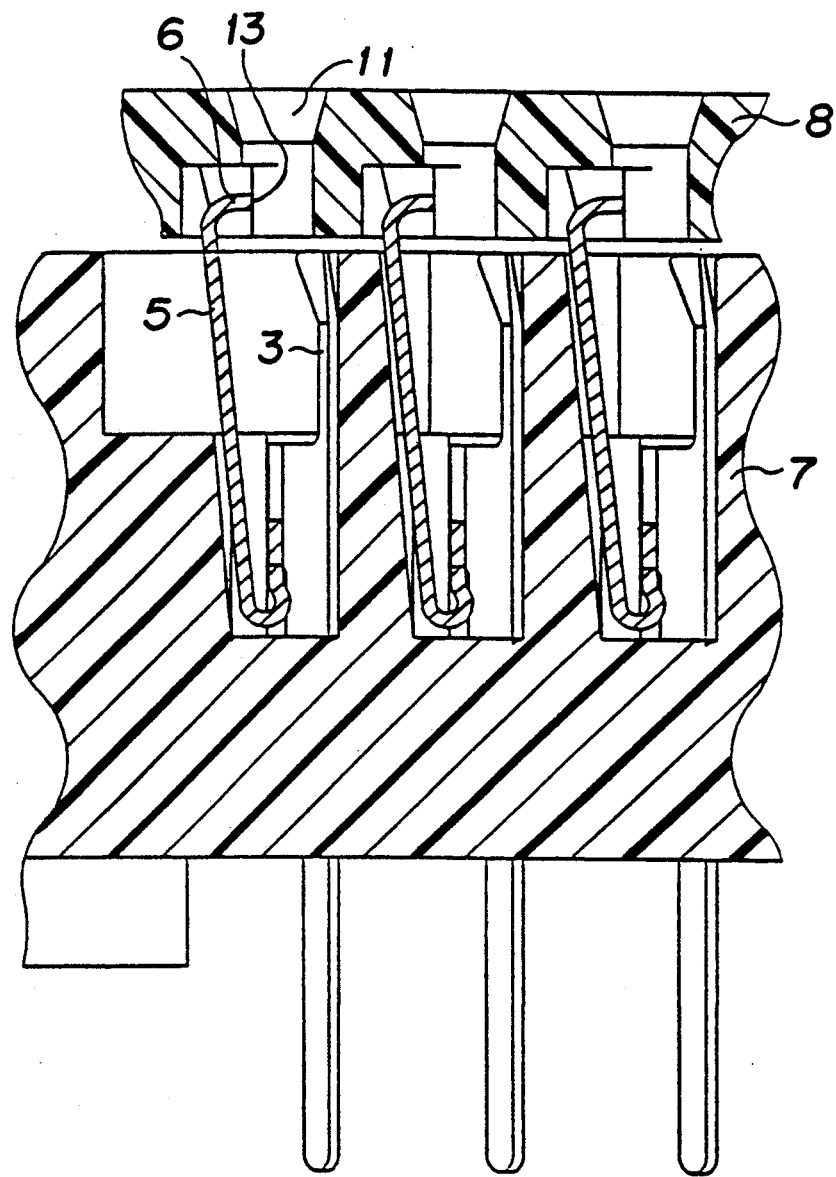
FIG. 6(A) is a sectional view of the socket in which the third contacting piece has been displaced in the opening direction by unidirectional lateral movement of a moving plate.
Figure 6B:
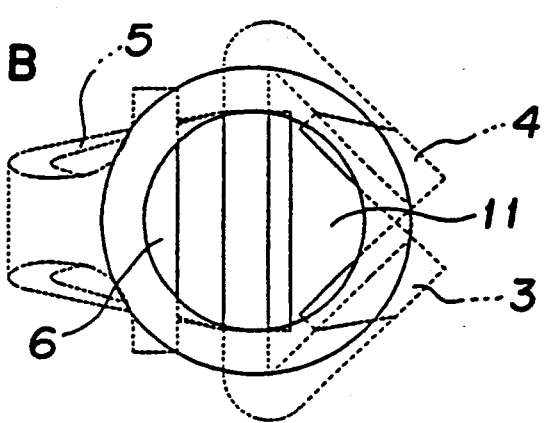
FIG. 6(B) is a plan view of the contactor in the state of FIG. 6(A)
Figure 7A:
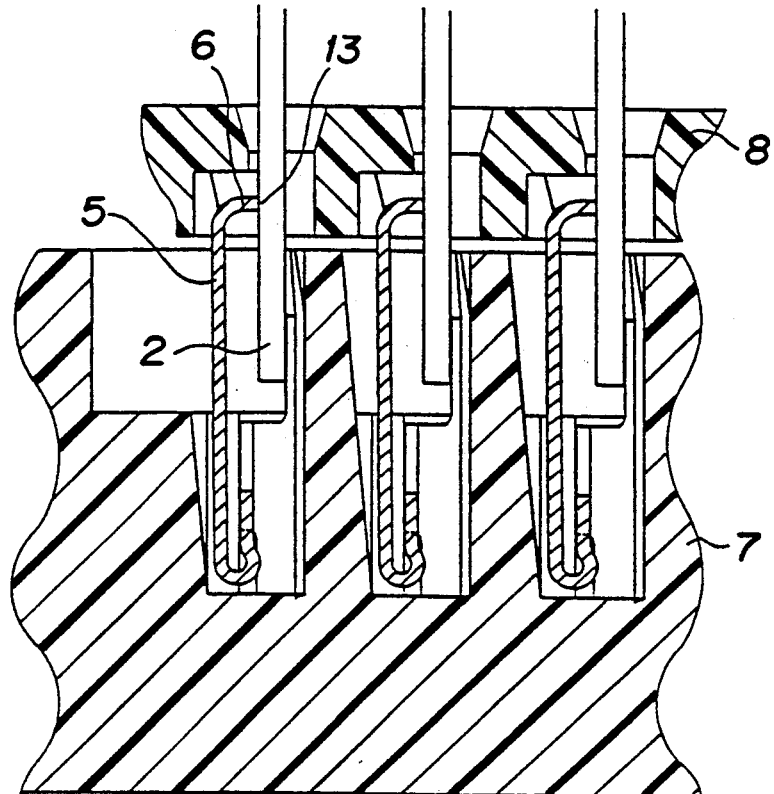
FIG. 7(A) is a sectional view of the socket in which the male terminal has been inserted and the third contacting piece has been restored in the closing direction to realize a nipping contact state of the male terminal among the first through third contacting pieces.
Figure 8:
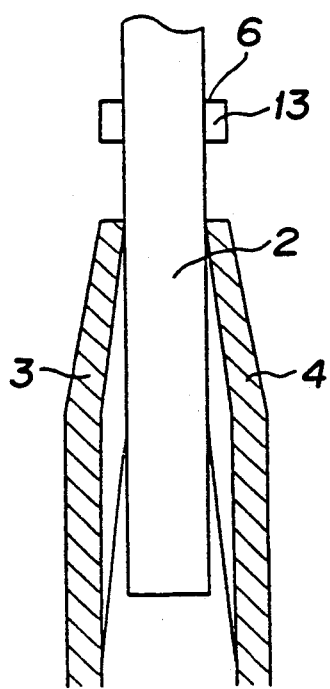
Figure 7B:
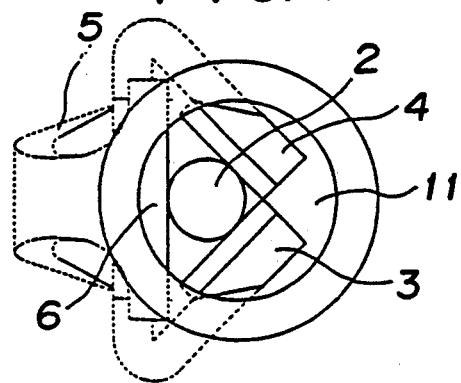
FIG. 7(B) is a plan view of the contactor in the state of FIG. 7(A)

As a means for displacing the third contacting piece in the opening direction, as shown in FIGS. 5 through 7, a socket substrate 7 is provided with a moving plate 8. The arrangement is such that when the moving plate 8 is laterally moved in a direction along an upper surface of the socket substrate 7, it presses the pressure bearing portion 6 of the third contacting piece 5 so as to be displaced in the opening direction. The contactor is implanted in an inner bottom wall of a contactor holding hole 9 so that it is held therein. A leg portion 10 is adapted to contact with a wiring board and projects downwardly through the substrate 7. The pressure bearing portion 6 is formed at the top end portion of the third contacting piece 5 and projects upwardly from an opening a& the upper planar surface of the substrate 7 through &he contact holding hole 9. The projecting portion of the top end portion of the third contacting piece 5 is retained at a step portion 12 formed on an inner wall of a male terminal insertion hole 11, so that when the moving plate 8 is laterally moved in a direction as shown in FIG. 6(A), the third contacting piece 5 is pressed in the opening direction by this step portion 12.

The pressure bearing portion 6 of the third contacting piece 5 projects upwardly from the front or top ends of the first and second contacting pieces 3 and 4 so as to be engaged with the moving plate 8. That is, the first and second contacting pieces 3 and 4 are of generally the same height, and the top end portion of &he third contacting piece 5 extends beyond the ends of &he first and second contacting pieces to form the pressure bearing portion 6. As described above, the pressure bearing portion 6 is adapted to bear an external pressure applied thereto, and also serves as a press contacting portion for the circular male terminal 2.

Further, as a means for increasing the elastic restoring force of the third contacting piece 5, the pressure bearing portion 6 of the third contacting piece 5 expands backwardly of the first and second contacting pieces 3 and 4 past the upper portions thereof, as shown in FIG. 5. The third contacting piece 5 is displaced backward in the opening direction into the position shown in FIGS. 6(A) and (B) from the position shown in FIGS. 5(A) and (B) to store an elastic force. With the stored elastic force, the pressure bearing portion 6 tends to restore the first and second contacting pieces 3 and 4, the third contacting piece 5 displacing the first and second contacting pieces 3 and 4 backward in the opening direction to attain the afore-mentioned sliding movements.

In the manner mentioned above &:he first and second contacting pieces 3 and 4 are brought into contact, under pressure, with a lower part of the circular male terminal 2, while the third contacting piece 5 is brought into contact, under pressure, with an upper part of the male terminal 2 with the pressure bearing portion 6.

Upon receipt of an external force to its pressure bearing portion 6 by the moving plate 8, the third contacting piece 5, as shown in FIGS. 6(A) and (B), is forceably displaced in the separator direction from the first and second contacting pieces 3 and 4 to form a circular male terminal insertion entrance between the first and second contacting pieces 3 and 4. The male terminal is inserted into this opening under no load.

As is shown in FIGS. 7(A) and (B), when elastically restored in the closing direction, the third contacting piece 5 is pressed against a side surface of the circular male terminal 2, and the second and third contacting pieces 3 and 4 are displaced in the opening direction by the pressing force of the third contacting piece 5 and contacted, under pressure, with the other side surface of the male terminal 2 under their elastic restoring force. The first and second contacting pieces 3 and 4 are slidingly moved on the side surface of the male terminal 2 during displacement thereof. In FIG. 1, the dotted lines show the contacting positions of the first and second contacting pieces 3 and 4 with respect to the male terminal 2 at the time the third contacting piece 5 is in an initial contact relation with the male terminal 5, while the solid lines show the state wherein the male terminal 2 is pressed and displaced by the third contacting piece 5, the first and second contacting pieces 3 and 4 being displaced by the pressing force of the third contacting piece 5.

The elastic force of the first through third contacting pieces 3, 4 and 5 is properly set so that the first and second contacting pieces 3 and 4 are in the above-mentioned relation with the third contacting piece 5. That is, the elastic force of the first and second contacting pieces 3 and 4 is set to be smaller than that of the third contacting piece 5, and the pressing force of the third contacting piece 5 against the male terminal 2 is set as such that the first and second contacting pieces 3 and 4 are displaced in the dilating direction by it.

Preferably, the foremost end portion of the third contacting piece 5 is bent in a hook shape toward the side of the first and second contacting pieces to form the pressure bearing portion 6. An end face of the pressure bearing portion 6 is pressed against the male terminal 2 to increase the press contacting force. The end face 13 of the pressure bearing portion 6 is planar, having the thickness of the plate of the contactor punched out of a plate material.

Restoration of the third contacting piece 5 can be obtained by cancelling the application of the external force to the pressure bearing portion 6. That is, when the unidirectional moving force of the moving plate 8 is cancelled, the third contacting piece 5 is elastically restored by its own force, and the moving plate 8 is laterally moved in the other direction by its elastic restoring force. At the same time, the third contacting piece 5 is pressed against the side surface of the male terminal 2 and the first and second contacting pieces 3 and 4 are caused to be contacted, under pressure, with the side surface of the male terminal 2 and slidingly moved therealong as already described above.

By such sliding movements of the first and second contacting pieces, an oxide film formed on the contacting surface is removed and an active metallic surface is exposed to attain a highly reliable contacting relation as already mentioned above.

FIG. 4 shows an expanded view of the three-way nip contact type contactor when it is punched out of a plate material. As is apparent from the FIG. 4, the third contacting piece 5, as well as the first and second contacting pieces 3 and 4, are punched out of a plate material so that the first and second contacting pieces 3 and 4 are located opposite each other, with the third contacting piece placed therebetween and bent at the position indicated by the dotted lines in FIG. 4 to form the contactor 1.

As described in the foregoing, a three-way nip contact type contactor according to the present invention includes first, second and third contacting pieces connected together at base end portions thereof and arranged side by side in rows extending toward the end portions thereof. The first and second contacting pieces are arranged to form two sides of a triangle, and the third contacting piece is arranged to form the remaining side thereof. A male terminal is nipped by and among the first through third contacting pieces to obtain a contacting relation between the male terminal and each of the first through third con&:acting pieces. The third contacting piece is provided at a front or top end portion thereof with a pressure bearing portion so that the third contacting piece, when an external force is applied to the pressure bearing portion, is displaced in an opening direction against the elasticity thereof in order to permit the male terminal to be inserted into and among the first through third contacting pieces. The first through third contacting pieces are arranged such that when the third contacting piece is elastically restored in a closing direction and pressed against a side surface of the male terminal, the first and second contacting pieces are displaced in the opening direction against the elasticity thereof by a pressing force of the third contacting piece and slidingly moved on the side surface of said male terminal. Accordingly, by applying an external force to the pressure bearing portion formed on the third contacting piece, the third contacting piece is dilated so that a male terminal can be inserted into and among the first through third contacting pieces under no load. Thus the insertion of a multipole type IC into a socket is facilitated. Furthermore, when the third contacting piece is displaced in the closing direction as a result of the cancellation of the external force exerted on its pressure bearing portion, it is pressed against the side surface of the male terminal, thereby displacing the first and second contacting pieces in the opening direction against the elasticity thereof. The first and second contacting pieces are caused to slidingly move along the side surface of the male terminal during their displacement. As a result, an active metallic surface is exposed to attain a clean contact relation. Accordingly, there can be provided a three-way nip contact type contactor in which the above-mentioned problems, namely, the difficulty of insertion, and therefore of removal, of a group of male terminals in a three-way nip contact type contactor, can be solved, and at the same time a highly reliable contact relation can be obtained.

Furthermore, in the three-way nip contact type contactor according to the present invention, by adding simple details, such as the proper setting of the elastic force, the formation of a pressure bearing portion, etc., as mentioned above, the above object can be achieved. For example, the present invention can be suitably practiced as a contactor of a socket used for a pin grid array having a plurality of circular male terminals projecting from a lower surface of an IC body.

Although one preferred embodiment of the present invention has been described in detail, the present invention should not be limited to this embodiment. Various changes and modifications can, of course, be made within the scope of the present invention.

What is claimed is:

1. A contactor, comprising:
   first and second contact pieces, each said contact piece having a base end at which said contact piece is connected to the other said contact piece, and each said contact piece extending from said base end toward a top end thereof adjacent to the other said contact piece such that said first and second contact pieces substantially form two sides of a triangle;
   means having a pressure bearing portion for elastically engaging a male terminal between said pressure bearing portion and said first and second contact pieces and displacing said pressure bearing portion in a direction toward the male terminal, pressing against a side surface of the male terminal so that the male terminal engages said first and second contact pieces and said first and second contact pieces are displaced in a direction away from the male terminal member against the elasticity thereof while sliding on the side surface of the male terminal, said pressure bearing portion substantially forming the third side of said triangle;
   wherein said top ends of said first and second contact pieces are of substantially the same height, and wherein said pressure bearing portion projects above said top ends of said first and second contact pieces.

2. The contactor of claim 1, wherein said means is a third contact piece having a base end connected to said base ends of said first and second contact pieces, said third contact piece extending from said base end adjacent to said first and second contact pieces to a top end of said third contact piece, said pressure bearing portion being provided on said top end of said third contact piece.

3. The contactor of claim 2, wherein said pressure bearing portion of said third contact piece of said means is displaced in the direction of the male terminal due to the elasticity of said third contact piece after said pressure bearing portion has been moved against the elasticity of said third contact piece to allow the male terminal to be received between said first, second and third contact pieces under no load.

4. The contactor of claim 2, wherein said first, second and third contact piece are one piece, punched from a single piece of metal.

5. The contactor of claim 2, wherein said base ends of said contact pieces have a leg portion connected therewith that projects downwardly.

* * * * *